United States Patent
Nakatsu et al.

(10) Patent No.: US 7,710,138 B2
(45) Date of Patent: May 4, 2010

(54) SEMICONDUCTOR CHIP AND SEMICONDUCTOR DEVICE INCLUDING THE SAME

(75) Inventors: Shinichi Nakatsu, Kawasaki (JP); Hideo Isogai, Kawasaki (JP); Takehiro Masumoto, Kawasaki (JP); Kazuyuki Nishizawa, Kawasaki (JP); Toshihide Tsuboi, Kawasaki (JP); Kimiharu Etou, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/348,386

(22) Filed: Jan. 5, 2009

(65) Prior Publication Data

US 2009/0121755 A1 May 14, 2009

Related U.S. Application Data

(62) Division of application No. 11/363,236, filed on Feb. 28, 2006, now Pat. No. 7,492,036.

(30) Foreign Application Priority Data

Feb. 28, 2005 (JP) .............................. 2005-054968

(51) Int. Cl.
*G01R 31/26* (2006.01)
*G01R 31/28* (2006.01)

(52) U.S. Cl. ........................ 324/763; 324/754; 324/765; 324/158.1; 702/119; 702/120; 438/18

(58) Field of Classification Search ............. 438/14–19; 324/754–765; 702/119–120
See application file for complete search history.

(56) References Cited

U.S. PATENT DOCUMENTS

| 5,508,631 | A | * | 4/1996 | Manku et al. ................ 324/763 |
| 5,509,019 | A | * | 4/1996 | Yamamura ................... 714/718 |
| 7,202,692 | B2 | * | 4/2007 | Miyano ....................... 324/765 |
| 7,317,241 | B2 | | 1/2008 | Matsuzaki et al. |
| 7,345,500 | B2 | * | 3/2008 | Bin ............................. 324/769 |
| 7,603,248 | B2 | * | 10/2009 | Sugiyama et al. ........... 702/119 |
| 2008/0238453 | A1 | * | 10/2008 | Lo et al. ...................... 324/754 |

FOREIGN PATENT DOCUMENTS

JP        11-17119        1/1999

* cited by examiner

*Primary Examiner*—Ha Tran T Nguyen
*Assistant Examiner*—Emily Y Chan
(74) *Attorney, Agent, or Firm*—Young & Thompson

(57) ABSTRACT

A semiconductor chip includes a plurality of pads; input/output circuits connected with the plurality of pads, respectively; a product data storage section configured to store a product data; and a setting section configured to set to an active state, each of the input circuits which is connected to one of the plurality of pads used for input to an internal circuit, and each of the output circuits which is connected to one of the plurality of pads used for output from the internal circuit, and set remaining input/output circuits to an inactive state, based on the product data.

11 Claims, 4 Drawing Sheets

SEMICONDUCTOR CHIP AND SEMICONDUCTOR DEVICE INCLUDING THE SAME

CROSS-REFERENCE TO RELATED APPLICATIONS

This application is a divisional of Application Ser. No. 11/363,236, filed on Feb. 28, 2006, now U.S. Pat. No. 7,492,036.

BACKGROUND OF THE INVENTION

1. Field of the Invention

The present invention relates to a semiconductor chip and a semiconductor device including the same.

2. Description of the Related Art

A package for a semiconductor chip to be installed is sometimes different depending on a user, even if the semiconductor chip is same. For this reason, a designer of the semiconductor chip needs to consider the arrangement of pads in advance so as to permit the semiconductor chip to be installed in various packages. Usually, the pad on the semiconductor chip and a lead of the package is electrically connected through a bonding wire. When the same semiconductor chip is installed on the packages in which the numbers of leads (pins) are different, the numbers of the pads to be connected through the bonding wires to the leads of the packages are different. Thus, there are the pads that are not connected through the bonding wire to the leads of the package, namely, so-called free pads. Since this free pad is in an electrically floating state, a signal applied to the adjacent wiring or other pad may be picked up as noise. Therefore, an internal circuit may be erroneously operated through an input circuit or output circuit connected to the free pad. For this reason, the erroneous operation can be prevented by changing the wiring pattern to be used and pulling up or down a signal line connected to the free pad, depending on the package. However, the position of the free pad is different for each package on which the semiconductor chip is installed, or for each user even if the packages are same. The change of a wiring pattern on the semiconductor chip for each package to be used to pull up and down the free pad increases the manufacture cost of the semiconductor chip. Also, the management cost and delivery time of the semiconductor chip are also increased.

As the technique related to a process for the free pad, a so-called bonding option circuit is known. For example, Japanese Laid Open Patent Application (JP-A-Heisei, 11-17119) discloses a technique in which leakage current is decreased in the bonding option circuit. A bonding option selecting circuit includes an input for receiving a first signal, an output for outputting the first signal, and a switching circuit connected between the input and the output. This switching circuit includes a section for generating a second signal. Also, the switching circuit provides a current path for the first signal. When the second signal is given, the first signal is transferred along the current path. That is, in a case of a free pad being not bonded, in the bonding option selecting circuit, a potential of the pad is fixed by a pull-down circuit composed of a transistor, and a signal of a low level is sent to the internal circuit. When the pad is bounded to a power source, the bonding option selecting circuit operates so as to hold the signal of a high level applied to the pad through a flip-flop in response to a timing signal sent from the internal circuit and send the signal of the high level to the internal circuit, in order to decrease the leak current. Therefore, the bonding option selecting circuit fixedly outputs to the internal circuit, the signal of the level corresponding to the bonded state of the pad. In this way, the signal level of the signal line connected to the free pad can be fixed to prevent an erroneous operation. However, in this circuit, the signal line that is not at the fixed level cannot be connected to the pad.

SUMMARY OF THE INVENTION

In an aspect of the present invention, a semiconductor chip includes a plurality of pads; input/output circuits connected with the plurality of pads, respectively; a product data storage section configured to store a product data; and a setting section configured to set to an active state, each of the input circuits which is connected to one of the plurality of pads used for input to an internal circuit, and each of the output circuits which is connected to one of the plurality of pads used for output from the internal circuit, and set remaining input/output circuits to an inactive state, based on the product data.

Here, it is preferable that the product data is invisible to a user.

Also, the product data preferably contains a data indicating a number of external pins of a package on which the semiconductor chip is installed.

In this case, the product data storage section includes a nonvolatile memory, in which the product data is written in a test of the semiconductor chip.

Also, the product data storage section may store the product data prior to shipment.

Also, the setting section may include a plurality of control lines provided for a number of kinds of packages on which the semiconductor chip is to be installed. The setting section outputs a control signal on one of the plurality of control lines based on the product data, such that the input/output circuits corresponding to a specific package on which the semiconductor chip is actually installed are activated.

In this case, each of the input circuits may include an input buffer circuit connected to at least one of the plurality of control lines. The input buffer circuit may be set to the active state when the control signal is received from the connected line, and to the inactive state when the control signal is not received. In this case, the each input circuit may further include a termination circuit. The termination circuit may output a signal with a predetermined level to the internal circuit when the input circuit is set to the inactive state.

Also, the input/output circuits set to the active state are substantially uniformly arranged around a periphery of the semiconductor chip in each package.

In another aspect of the present invention, a semiconductor device includes a plurality of leads; a plurality of bonding wires connected to the plurality of leads, respectively; and a semiconductor chip. The semiconductor chip includes a plurality of pads, a part of which is connected to the plurality of bonding wires; input/output circuits connected with the plurality of pads, respectively; a product data storage section configured to store a product data; and a setting section configured to set to an active state, each of the input circuits which is connected to one of the part of the plurality of pads used for input to an internal circuit, and each of the output circuits which is connected to one of the part of the plurality of pads used for output from the internal circuit, and set remaining input/output circuits connected to pads other than the part of the plurality of pads, to an inactive state, based on the product data.

In another aspect of the present invention, a method of controlling a semiconductor device, is achieved by turning on power of a semiconductor device; by decoding the product data in one of the registers to output a control signal on at least one of control lines; by setting a part of input circuits to an active state and a remaining part to an inactive state, in response to the control signal; and by transferring input signals supplied to pads connected with the part of the input circuits into an internal circuit.

Here, the setting may be achieved by setting a part of output circuits to an active state and a remaining part to an inactive state, in response to the control signal.

Also, when a rest operation is carried out, the decoding may be carried out.

DESCRIPTION OF THE PREFERRED EMBODIMENTS

Hereinafter, a semiconductor device including a semiconductor chip of the present invention will be described in detail with reference to the attached drawings.

Figure 1:
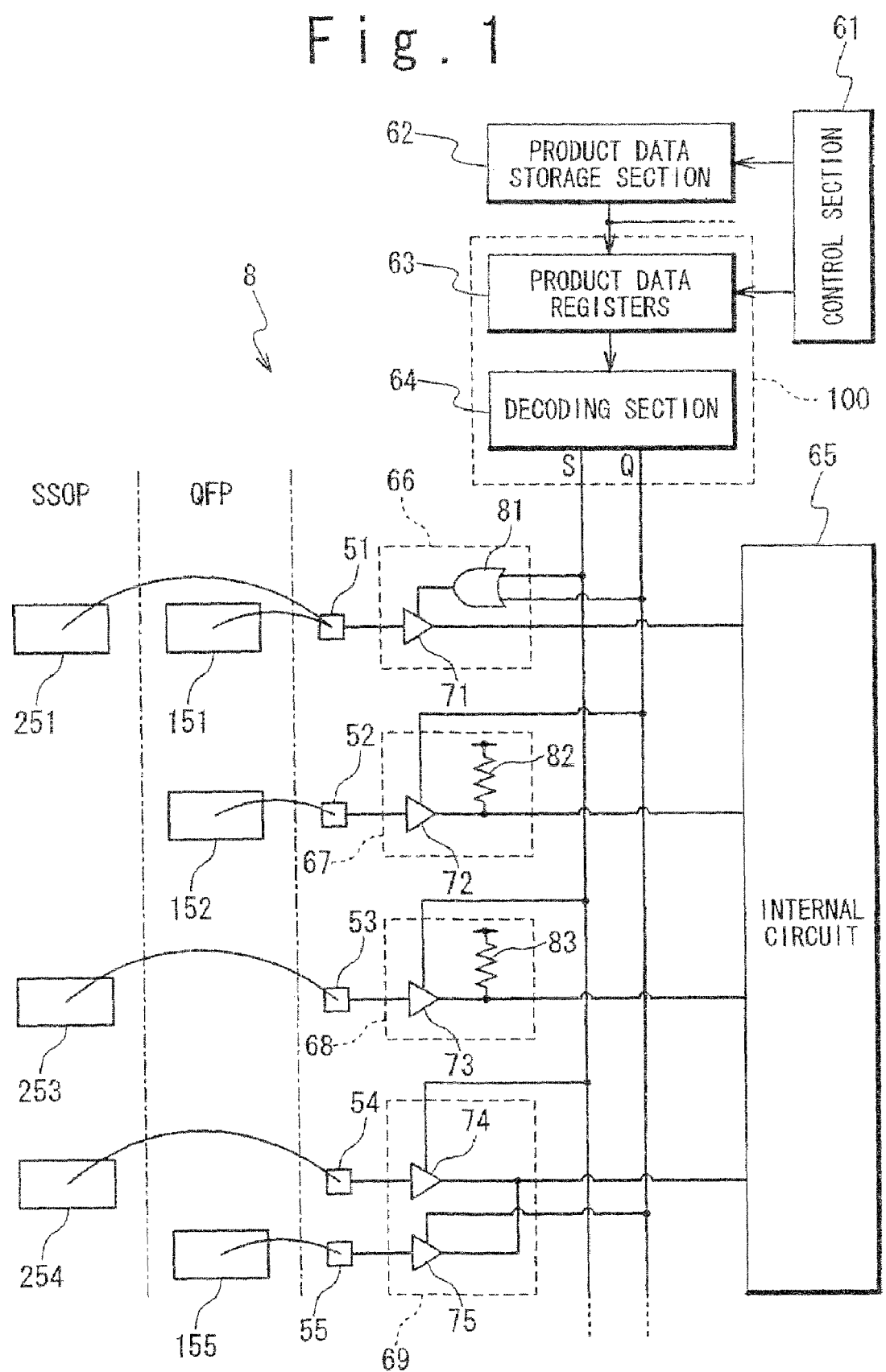
FIG. 1 is a diagram showing a part of input/output circuits in a semiconductor device according to an embodiment of the present invention.

FIG. 1 is a diagram showing a part of an external signal input section in a semiconductor integrated circuit. In FIG. 1, a semiconductor chip 8 is shown on the right side, and a lead (external pin) to which the semiconductor chip 8 is connected is shown on the left side. In FIG. 1, two kinds of leads are jointly shown, one kind of leads is for an SSOP (Shrink Small Outline Package) package and the other kind of leads is for a QFP (Quad Flat Package) package.

Figure 3:
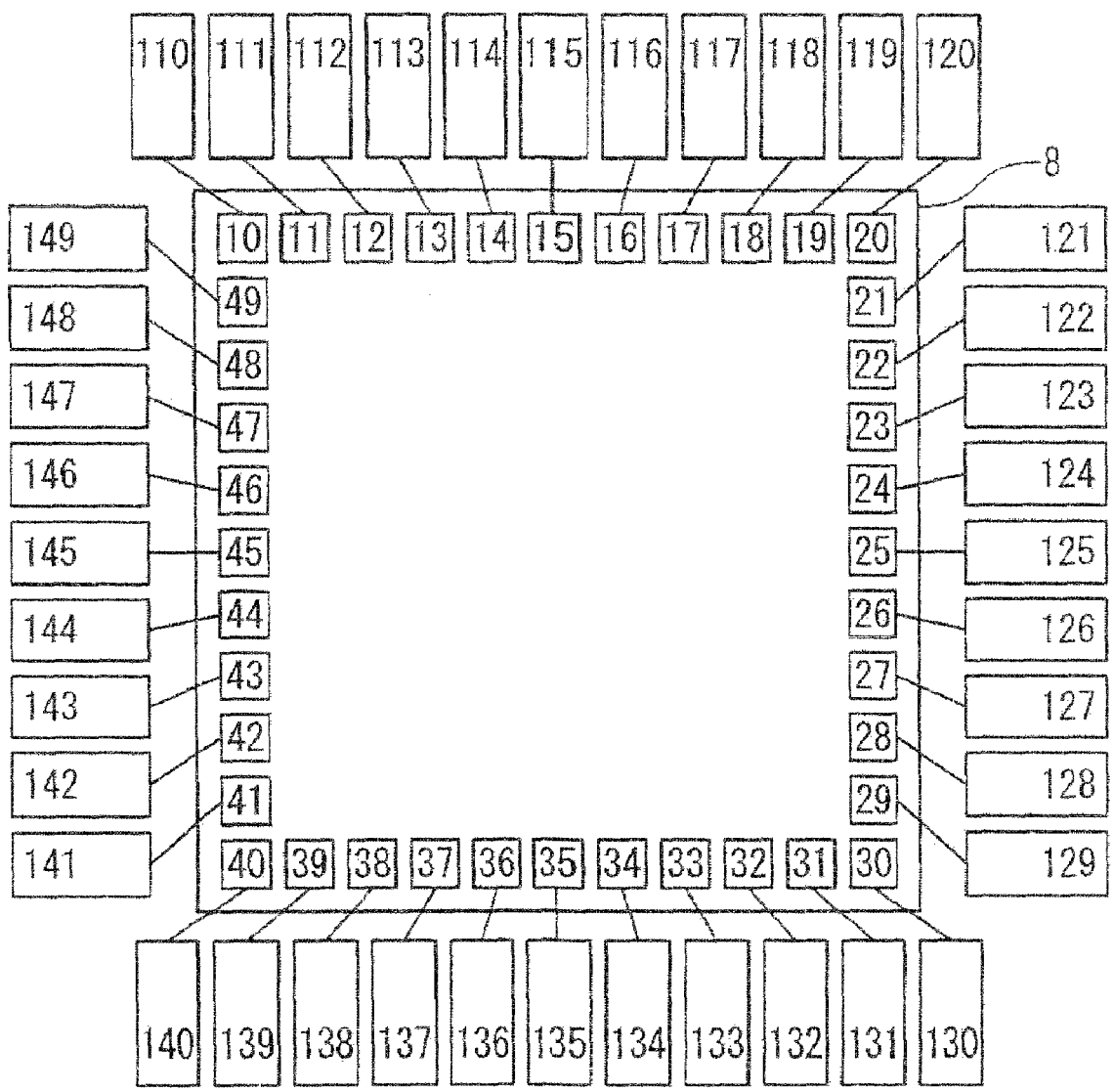
FIG. 3 is a diagram showing a connection when a semiconductor chip is installed on a QFP package.

FIG. 3 is a diagram showing connections of the semiconductor chip 8 installed on the QFP package and leads 110 to 149 connected to the semiconductor chip 8. The semiconductor chip 8 has 40 pads 10 to 49. The 40 leads 110 to 149 are arranged on the QFP package. In FIG. 3, the pads 10 to 49 are connected to the leads 110 to 149, respectively. The leads 110 to 120 are provided on the top side of the package, the leads 121 to 129 are provided on the right side of the package, the leads 130 to 140 are provided on the bottom side, and the leads 141 to 149 are provided on the left side of the package. This QFP package has the 40 pins.

Figure 4:
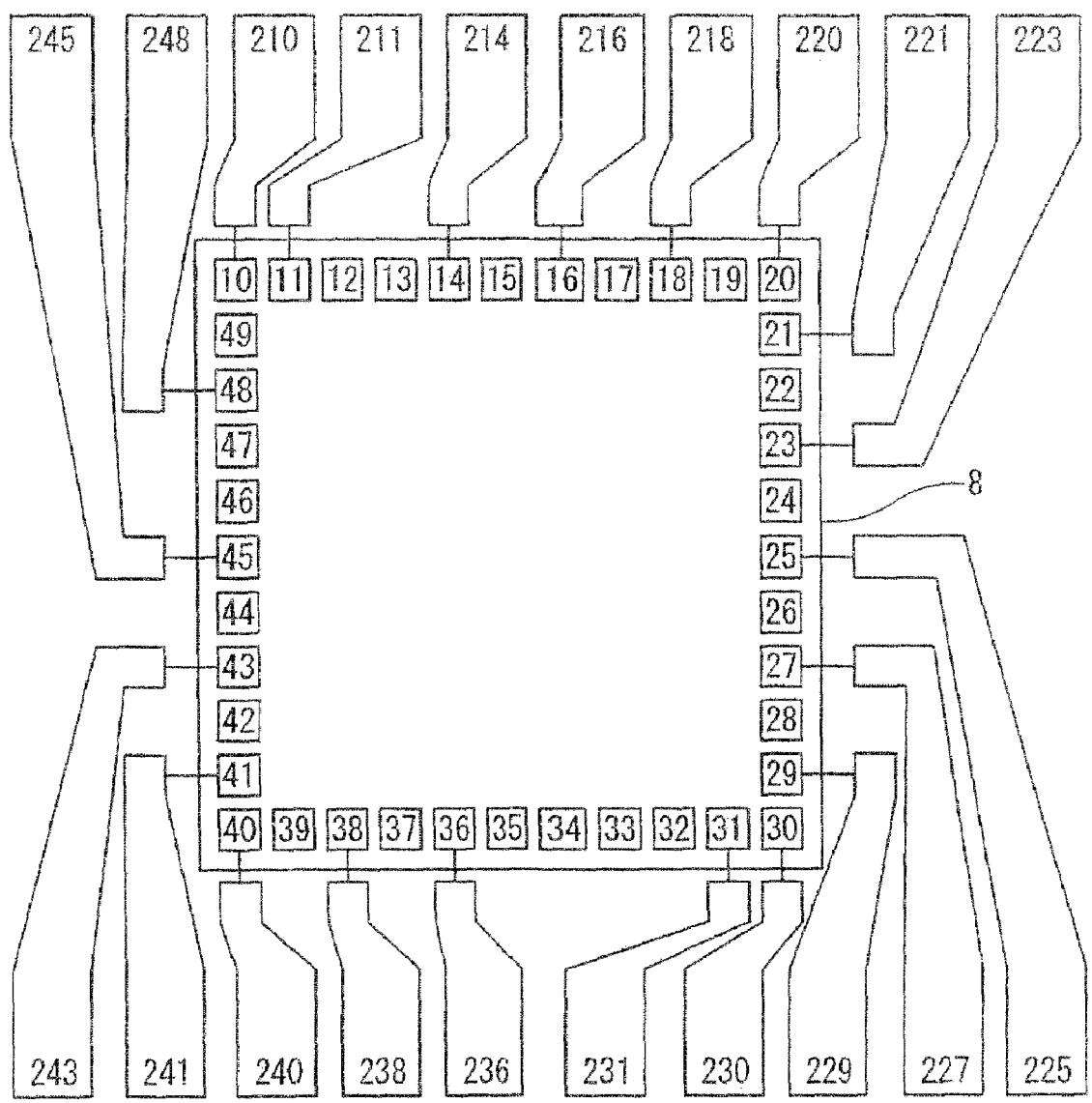
FIG. 4 is a view showing a connection when the semiconductor chip is installed on an SSOP package.

When the same semiconductor chip 8 as shown in FIG. 3 is installed on the SSOP package, the connection is as shown in FIG. 4. As compared with the QFP package, the SSOP package has thick leads and the small number of leads. For this reason, some of the pads of the semiconductor chip 8 are not connected to the leads. That is, the function is reduced or limited. In FIG. 4, on the top side of the chip, the pads 10, 11, 14, 16 and 18 are connected to the leads 210, 211, 214, 216 and 218, and the pads 12, 13, 15, 17 and 19 are not connected to the leads. On the right side of the chip, the pads 20, 21, 23, 25, 27 and 29 are connected to the leads 220, 221, 223, 225, 227 and 229, and the pads 22, 24, 26 and 28 are not connected to the leads. On the bottom side of the chip, the pads 30, 31, 36 and 38 are connected to the leads 230, 231, 236 and 238, and the pads 32 to 35, 37 and 39 are not connected to the leads. On the left side of the chip, the pads 40, 41, 43, 45 and 48 are connected to the leads 240, 241, 243, 245 and 248, and the pads 42, 44, 46, 47 and 49 are not connected to the leads. The leads 245, 248, 210, 211, 214, 216, 218, 220, 221 and 223 extend in a direction of the top side of the package, and the leads 225, 227, 229, 230, 231, 236, 238, 240, 241 and 243 extend in a direction of the bottom side of the package. This SSOP has 20 pins. Thus, the number of pads used for connection is approximately uniform over the periphery or four sides in every package.

In this way, when the semiconductor chip is installed on the packages in which the numbers of the pins are different, the excess or deficiency is caused with regard to the number of the pins for every package. The present invention provides the semiconductor chip that can be installed on a plurality of kinds of packages in which the numbers of the external leads are different. If the pad that is not connected to the lead receives a signal, there is a possibility that the semiconductor chip erroneously operates. Therefore, the pad cannot be kept in the floating state as it is. Also, when the pad connected to an output circuit is not connected to the lead, electric power is uselessly consumed if the output circuit operates. Conventionally, only the pads to be used are bonded to the leads for each kind of package, and the layout of the semiconductor chip is determined such that unused input pads are pulled up or down and output to unused output pads are inhibited.

Referring to FIG. 1 again, the semiconductor integrated circuit of the present invention includes a control section 61, a product data storage section 62, a product data register 63, a decoding section 64, an internal circuit 65, input circuits 66 to 69 and pads 51 to 55. The product data register 63, the decoding section 64, and signal lines from the decoding section 64 constitute a setting section 100.

The product data storage section 62 outputs product data stored therein to the product data register 63 in response to an instruction from the control section 61. The product data includes external pin data. The product data register 63 holds the product data outputted from the product data storage section 62 under control by the control section 61. The decoding section 64 decodes the held product data and generates a signal S and a signal Q in accordance with the decoding result. The signal S is sent to the input circuits 66, 68 and 69. The signal Q is sent to the input circuits 66, 67 and 69. In this example, the product data is described to be decoded into two signals However, the present invention is riot limited to this.

The input circuit 66 transfers an input signal from the pad 51 to the internal circuit 65 in accordance with the signal S or the signal Q. The pad 51 is connected to the lead (external pin) 251 by the bonding wire when the semiconductor chip 8 is installed on the SSOP package, and it is connected to the lead (external pin) 151 by the bonding wire when the semiconductor chip 8 is installed on the QFP package.

The input circuit 67 transfers an input signal from the pad 52 to the internal circuit 65 in accordance with the signal Q. The pad 52 is connected to the lead 152 by the bonding wire when the semiconductor chip 8 is installed on the QFP package. However, the pad 52 is not used for connection, when the semiconductor chip 8 is installed on the SSOP package.

The input circuit 68 transfers the signal from the pad 53 to the internal circuit 65 in accordance with the signal S. The pad 53 is connected to the lead 253 by the bonding wire when the semiconductor chip 8 is installed on the SSOP package. However, the pad 53 is not used for connection, when the semiconductor chip 8 is installed on the QFP package.

The input circuit 69 transfers the signals from the pads 54 or 55 to the internal circuit 65 in accordance with the signal S and the signal Q, respectively. When the semiconductor chip 8 is installed on the SSOP package, the pad 54 is connected to the lead 254, and the pad 55 is not used for connection. When the semiconductor chip 8 is installed on the QFP package, the pad 54 is not used for connection, and the pad 55 is connected to the lead 155.

The control section 61 is activated immediately after the power is supplied to the semiconductor chip 8, or a reset operation is carried out while the power is supplied to the semiconductor chip 8, and controls an initial setting operation based on the product data. This initial setting is carried out prior to the start of an operation instructed by a user.

The product data storage section 62 stores the data with regard to the semiconductor device in which this semiconductor chip 8 is installed. The product data includes a shape of the package, the number of pins, memory capacity, a range of an operation function and the like. The product data storage section 62 has a flash memory, and the product data is stored therein prior to the installation of the semiconductor chip on the package. As the storage memory included in the product data storage section 62, the flash memory is exemplified in this case. However, it may be a non-volatile memory that the product data can be recorded prior to the installation on the package. Since the flash memory is included, the product data can be stored simultaneously with the test as to whether the semiconductor chip has good quality. Thus, the loss of the step is small.

The product data stored in the product data storage section 62 is sent to the respective sections of the semiconductor chip 8, in accordance with the control of the control section 61. A part of the product data concerning with the number of the external pins (leads) is held in the product data register 63. The holding timing is controlled by the control section 61. The product data is held in the product data register 63 until the power source is turned off. Thus, the product data outputted from the product data register 63 is not changed until the power source is turned off.

The decoding section 64 decodes the product data held in the product data register 63 and outputs a control signal corresponding to the number of the external pins. In this example, the decoding section 64 outputs the two kinds of signals Q and S, in accordance with the package on which the semiconductor chip 8 is installed and the number of the external pins thereof. The signal Q becomes active when the installation package is the QFP package, to validate the signal inputted to the pad. The signal S becomes active when the installation package is the SSOP package to validate the signal inputted to the pad.

The product data may include a pin number data and a memory size data. A code is assigned to the number of the external pins, and the pin number data is indicated based on the code. For example, the code "000" is assigned in case of 32 pins and the code "001" is assigned in case of 40 pins. When this code is decoded, a signal corresponding to the number of the pins provided for the product (semiconductor device) can be generated. That is, the decoding section 64 decodes this code, and outputs the signal S when the code is "000", and outputs the signal Q when the code is "001". Thus, in the semiconductor chip installed on the SSOP package, the code "000" as the product data is set in the product data storage section 62. In the semiconductor chip installed on the QFP package, the code "001" as the product data is set in the product data storage section 62. When the product data storage section 62 is configured by the flash memory, the setting of the product data to the product data storage section 62 can be carried out in parallel to the chip test for checking the operational of the semiconductor chip.

In this way, the input circuits 66 to 69 take therein the necessary signals, so that the operation states of the input circuits 66 to 69, i.e., an active state and inactive state thereof are controlled. The fact that the input circuits 66 to 69 are active imply that buffers 71 to 75 of the input circuits 66 to 69 output the signals of the high level or low level in response to the input signals. Also, the fact that the input circuits 66 to 69 are inactive imply that the buffers 71 to 75 are in high impedance states, namely, that both of drive transistors and pull-up transistors are turned off. Here, although the product data is defined in accordance with the number of the external pins, the present invention is not limited to the above example. A unique code for each user may be assigned based on every kind of the number of the external pins. In such a case, even if the pin arrangement is different for each user under the same number of the external pins, the present invention can cope with the case.

The input circuit 66 receives the signals S and Q from the decoding section 64 and controls the transfer of the external signal that is applied to the pad 51 to the internal circuit 65. The input circuit 66 includes the buffer 71 for controlling the validity/invalidity of the signal inputted from the pad 51; and an OR circuit 81 for receiving the signal S and the signal Q and controlling the buffer 71. The OR circuit 81 outputs a control signal for activating the buffer 71 when any of the signal S and the signal Q becomes active. The buffer 71 transfers the signal inputted from the pad 51 to the internal circuit 65 in response to the control signal from the OR circuit 81. Thus, when the package on which the semiconductor chip 8 is installed is the SSOP package, the signal inputted from the external pin 251 is transferred to the pad 51 connected through the bonding wire and transferred to the internal circuit 65 through the buffer 71 from the pad 51. Even if the package on which the semiconductor chip 8 is installed is the QFP package, the signal inputted from the external pin 151 is transferred to the pad 51 connected through the bonding wire and transferred to the internal circuit 65 through the buffer 71 from the pad 51. That is, the signal inputted to the external pin connected to the pad 51 is transferred to the internal circuit 65 regardless of the kind of the installation package. Here, the logical sum of the signals S and Q is carried out to obtain the control signal for controlling the buffer. However, if the signal is transferred regardless of the package, it is allowable to always pass the signal.

The input circuit 67 receives the control signal Q from the decoding section 64 and controls the transfer of the external signal that is applied to the pad 52 to the internal circuit 65. The pad 52 is connected to the external pin 152 when the package on which the semiconductor chip 8 is installed is the QFP package. The input circuit 67 includes the buffer 72 for controlling the validity/invalidity of the signal inputted from the pad 52; and a resistor 82. The buffer 72 is controlled in response to the signal Q. That is, if the signal Q is active, the buffer 72 transfers the signal inputted to the pad 52 to the internal circuit 65. If the signal Q is inactive, the signal inputted to the pad 52 is not transferred to the internal circuit 65, and a signal with a constant level set by the resistor 82 is inputted to the internal circuit 65. Thus, if the installation package is the QFP package, the signal inputted to the external pin 152 is transferred to the pad 52 connected through the boding wire and transferred to the internal circuit 65 through the buffer 72 from the pad 52. If the installation package is not the QFP package, the pad 52 is separated from the internal circuit 65 by the buffer 72, and the signal of the constant level set by the resistor 82 is transferred to the internal circuit 65. This implies that even if the level of the pad 52 becomes uncertain, the pad has no influence on the internal circuit 65. That is, the erroneous operation can be protected.

The input circuit 68 receives the signal S from the decoding section 64 and controls the transfer of the external signal that is applied to the pad 53 to the internal circuit 65. The pad 53 is connected to the external pin 253 if the package on which the semiconductor chip 8 is installed is the SSOP package. The input circuit 68 includes the buffer 73 for controlling the validity/invalidity of the signal inputted from the pad 53; and a resistor 83. The buffer 73 is controlled by the signal S. That is, if the signal S is active, the buffer 73 transfers the signal inputted to the pad 53 to the internal circuit 65. If the signal S is inactive, the signal inputted to the pad 53 is not transferred to the internal circuit 65, and a signal with a level set by the resistor 83 is transferred to the internal circuit 65. Thus, if the installation package is the SSOP package, the signal inputted to the external pin 253 is transferred to the pad 53 connected through the boding wire and transferred to the internal circuit 65 through the buffer 73 from the pad 53. If the installation package is not the SSOP package, the pad 53 is separated from the internal circuit by the buffer 73, and the signal of the constant level set by the resistor 83 is transferred to the internal circuit. This implies that even if the level of the pad 53 becomes uncertain, the pad has no influence on the internal circuit 65.

The input circuit 69 receives the signals S and Q from the decoding section 64 and changes the pad position of the signal that is inputted to the internal circuit 65. That is, of the signals applied to the pad 54 and the pad 55, the signal that is transferred to the internal circuit is changed depending on whether the package including the semiconductor chip 8 is the SSOP package or QFP package. The input circuit 69 includes the buffer 74 for controlling the validity/invalidity of the signal inputted from the pad 54; and the buffer 75 for controlling the validity/invalidity of the signal inputted from the pad 55. The buffer 74 is controlled based on the signal S. That is, the buffer 74 transfers the signal inputted to the pad 54 to the internal circuit 65, if the signal S is active, and does not transfer the input signal if the signal S is inactive. The buffer 75 is controlled based on the signal Q. That is, the buffer 75 transfers the signal inputted to the pad 55 to the internal circuit 65, if the signal Q is active, and does not transfer the input signal if the signal Q is inactive. The output of the buffer 74 and the output of the buffer 75 are connected to the internal circuit 65. Thus, if the signal S is active, the signal of the pad 54 is supplied to the internal circuit 65, and if the signal Q is active, the signal of the pad 55 is supplied to the internal circuit 65. In this way, if the installation package is the SSOP package, the signal inputted to the external pin 254 is transferred to the pad 54 connected through the boding wire and transferred to the internal circuit 65 through the buffer 74 from the pad 54. If the installation package is the QFP package, the signal inputted to the external pin 155 is transferred to the pad 55 connected through the boding wire and transferred to the internal circuit 65 through the buffer 75 from the pad 55. That is, the pad to which the signal is inputted is different between the case when the installation package is the SSOP package and the case when the installation package is QFP package. Thus, the free degree can be secured when the position of the external pin is set.

Heretofore, the setting of the input circuit has been described. In case of the input circuit, if the free pad is not electrically connected and this is set in the floating state, the erroneous operation is caused. Thus, a termination process of the input circuit connected to the pad must be executed. For this reason, as mentioned above, when the pad is not used, the input circuit is processed such that the input level to the internal circuit is fixed. Also, in case of the output pin, unlike the case of the input pin, there are few erroneous operations. However, the consumption power can be reduced by setting an output buffer to be active/inactive.

Figure 2:
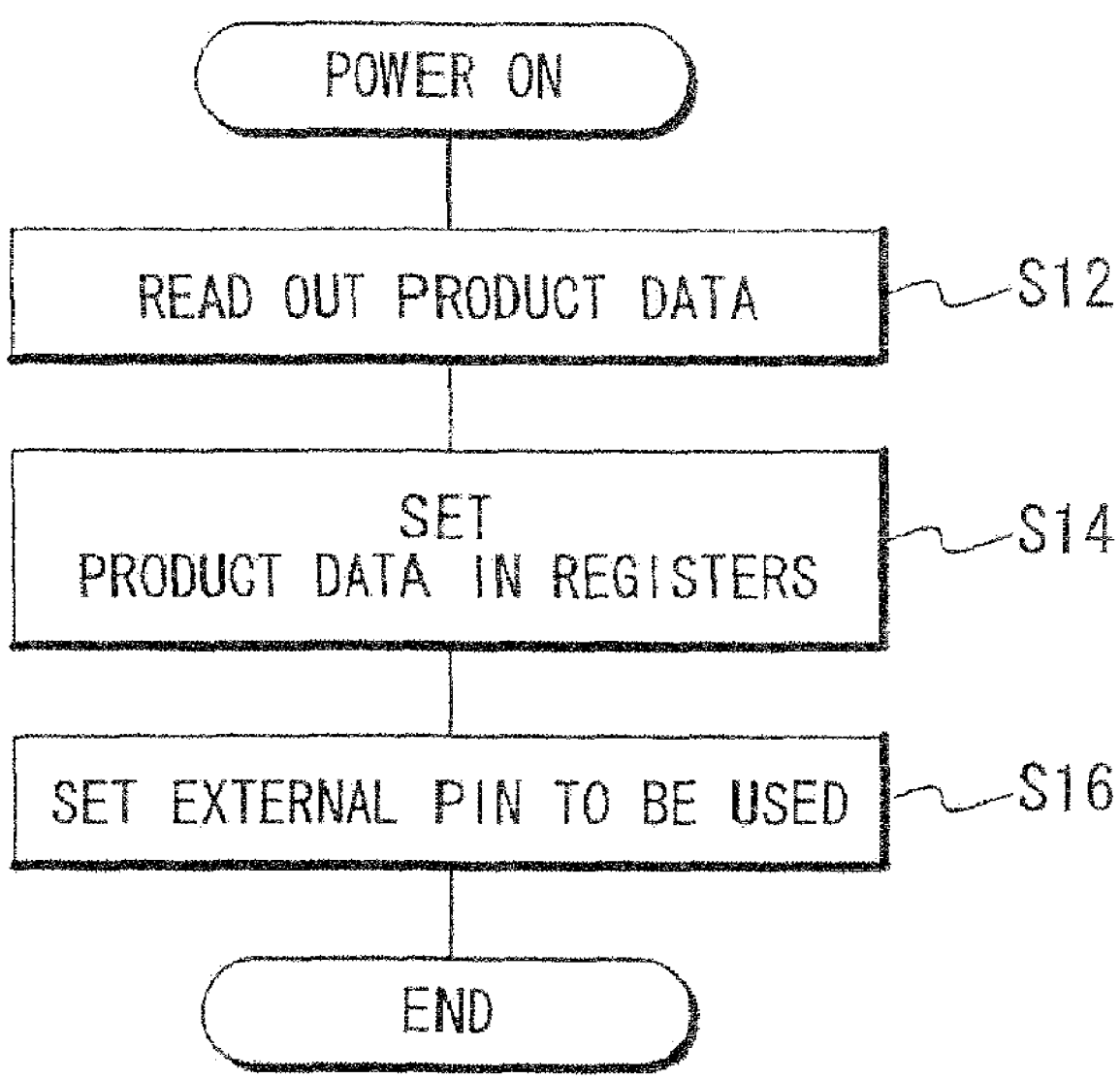
FIG. 2 is a flowchart showing an input pin setting operation in the semiconductor device according to the embodiment.

Such setting of the input/output circuit is carried out when the power is supplied to the semiconductor chip 8, as shown in FIG. 2. When the power is supplied, the circuit operation of the semiconductor chip 8 is started. The operation for setting the input/output circuit of the present invention is carried out immediately after the operation start. Immediately after the supply of the power, the control section 61 is activated and then starts the operation for setting the input/output circuit. At this time, the semiconductor chip 8 is still in the reset state for the user.

At first, the access to the product data storage section 62 storing the setting data is started. The product data stored in the product data storage section 62 is sequentially read (Step S12). The product data stored in the product data storage section 62 includes adjustment data of respective sections in the chip, in addition to the data of the package on which the semiconductor chip 8 is installed, the data with regard to the external pin and the like. In the product data, when the data of the package on which the semiconductor chip 8 is installed or the data with regard to the external pin is read, the control section 61 sets the data in the product data register 63 (Step S14). The product data register 63 outputs the latched data.

When the data with regard to the external pin is outputted from the product data register 63, the decoding section 64 decodes the data with regard to the external pin and sets the control signal S or signal Q active. The input circuits 66 to 69 control the respective buffers in accordance with the control signals S and Q and set the validity/invalidity of the signal of the connected pad (Step S16).

When the setting of the input/output circuits has been completed, the reset of the semiconductor chip 8 is released and then starts an initial setting sequence of a user. After that, the application of the user is executed. The user cannot access the product data storage section 62 and rewrite the product data register 63. That is, the product data is invisible to the user.

In this way, even if the semiconductor chip 8 is installed on the QFP package shown in FIG. 3, or even if it is installed on the SSOP package shown in FIG. 4, the operation is possible through the defined input/output pin. That is, if the main functions are same, the same semiconductor chip can be used for different kinds of packages without changing the semiconductor chip size on the basis of the size of a built-in memory and the number of the input/output signals. In the above, the case of the installation on the QFP or SSOP package has been exemplified and described. However, the case of the installation on a different package is similarly possible. Also, it is naturally possible to apply to the packages of three or more kinds. Thus, the layout design for each installation package is not required, and the product data may be written to the chip prior to the shipment. Hence, the mass production effect of the semiconductor chips is improved, which leads to the effect of the reduction in the chip cost.

According to the present invention, even when the installation package is different, the chip can be commonly used if the functions to be required are same. Also, according to the present invention, the same chip can be installed on the different type of the package. Thus, due to the mass production effect, it is possible to provide the cheaper semiconductor chip.

What is claimed is:

1. A method of controlling a semiconductor device, said semiconductor device comprising a plurality of pads, input circuits each connected with a respective one of said plurality of pads, and a product data storage section configured to store a product data, said method comprising:

turning on power of a semiconductor device;

decoding said product data to output a control signal on at least one control line;

setting a part of input circuits to an active state and a remaining part to an inactive state, in response to said control signal, whereby pads associated with the remaining part of said input circuits are prevented from being in a floating state; and transferring input signals supplied to pads connected with the part of said input circuits into an internal circuit.

2. The method according to claim 1, wherein said setting comprises:

setting a part of output circuits to an active state and a remaining part to an inactive state, in response to said control signal.

3. The method according to claim 1, wherein when a reset operation is carried out, said decoding is carried out.

4. The method according to claim 1, wherein said product data is invisible to a user.

5. The method according to claim 1, wherein said product data contains a data indicating a number of external pins of a package on which said semiconductor chip is installed.

6. The method according to claim 5, wherein said product data storage section comprises a nonvolatile memory, in which said product data is written in a test of said semiconductor chip.

7. The method according to claim 1, wherein said product data storage section stores said product data prior to shipment.

8. The method according to claim 1, wherein said setting step comprises:

outputting a control signal on one of a plurality of control lines based on product data stored in said product data storage section, each of said plurality of control lines corresponding to a respective kind of package on which said semiconductor chip is to be installed, such that said input/output circuits corresponding to a specific package on which said semiconductor chip is actually installed are activated.

9. The method according to claim 8, wherein each of said input circuits comprises:

an input buffer circuit connected to at least one of said plurality of control lines, and said input buffer circuit is set to the active state when said control signal is received from the connected line, and to the inactive state when said control signal is not received.

10. The method according to claim 9, wherein said each input circuit further comprises a termination circuit, and said termination circuit outputs a signal with a predetermined level to the internal circuit when said input circuit is set to the inactive state.

11. The method according to claim 1, wherein said input/output circuits set to the active state are substantially uniformly arranged around a periphery of said semiconductor chip in each package.

\* \* \* \* \*